United States Patent [19]
Cova

[11] Patent Number: 4,963,727
[45] Date of Patent: Oct. 16, 1990

[54] ACTIVE QUENCHING CIRCUIT FOR AVALANCHE PHOTODIODES

[75] Inventor: Sergio Cova, Milan, Italy

[73] Assignee: Consiglio Nazionale Delle Ricerche, Milan, Italy

[21] Appl. No.: 422,899

[22] Filed: Oct. 18, 1989

[30] Foreign Application Priority Data

Oct. 20, 1988 [IT] Italy .................. 22367 A/88

[51] Int. Cl.$^5$ .................................. H01J 40/14
[52] U.S. Cl. .......................... 250/214 R; 307/311
[58] Field of Search ........... 250/214 R, 211 J, 370.01, 250/370.14; 307/311, 333, 358; 357/13; 361/55

[56] References Cited

U.S. PATENT DOCUMENTS

| | | | |
|---|---|---|---|
| 4,001,614 | 1/1977 | Dahlinger | 307/311 |
| 4,303,861 | 12/1981 | Ekstrom | 250/370.14 |
| 4,389,695 | 6/1983 | Carpenter, Jr. | 361/55 |
| 4,479,052 | 10/1984 | Suzuki | 307/311 |
| 4,730,128 | 3/1988 | Seki | 307/311 |
| 4,754,131 | 6/1988 | Bethea et al. | 250/211 J |

*Primary Examiner*—David C. Nelsm
*Assistant Examiner*—Que Tan Le
*Attorney, Agent, or Firm*—Griffin Branigan & Butler

[57] ABSTRACT

The quenching circuit comprises a signal comparator (CP) having a first input connected to the photodiode (SPAD) under control and a second input connected to a balancing impedance (C) equal to that of the photodiode. At the output of the comparator (CP) there is connected a signal generator (M), which generates a quenching signal (S) having a predetermined duration each time there is an imbalance between the two inputs of the comparator (CP). Circuital switching means (I1, I2, I3, I4) are provided, capable of holding the bias voltage of the photodiode normally high and of lowering it below the breakdown level following the generation and for the entire holding time of the quenching signal.

12 Claims, 4 Drawing Sheets

ACTIVE QUENCHING CIRCUIT FOR AVALANCHE PHOTODIODES

BACKGROUND OF THE INVENTION

1. Field of the Invention

This invention relates to an active quenching circuit for single photon semiconductor avalanche photodiodes, particularily for photodies that biased with a reverse voltage higher than the breakdown voltage and operating in a triggered avalanche mode. The invention is particularly suitable for operation with a photodiode in a remote position.

2. Prior Art and Other Considerations

The operating principle of semiconductor photodiodes operating in a triggered avalanche mode (or Geiger mode avalanche diode) is well known. In particular it is known that in such devices, when biased at a reverse voltage higher than the breakdown voltage, a single charge carrier (electron or hole) generated by the absorption of a single photon can trigger an avalanche process which is self-sustaining thanks to the high intensity of the electric field. To cause the avalanche to terminate a quenching circuit is used which momentarily lowers the bias voltage below the breakdown level and then rapidly restores the initial bias so that the photodiode is immediately ready to detect the subsequent photon.

It is necessary to bear in mind that, in the technical-scientific literature, there is no universally used denomination to indicate the semiconductor avalanche devices operating as described above. They have been indicated with several denominations, such as Single Photon Avalanche Diode, SPAD; Triggered Avalanche Detector, TAD; Geiger Mode Avalanche Diode and still others. For the sake of brevity, we will hereafter use the denomination single photon avalanche diode and the acronym "SPAD" to indicate a semiconductor device operating in the triggered avalanche mode, as described above.

To operate correctly, the quenching circuit must detect the leading edge of the avalanche current coming from the photodiode and in response to it:

(a) produce a standard output pulse well synchronized with such edge;

(b) apply a voltage pulse to the photodiode to lower its bias down to the breakdown voltage or below it (avalanche quenching);

(c) hold the voltage across the photodiode at the quenching level for a predetermined time interval (hold-off);

(d) at the end of such time interval, restore the voltage across the photodiode to the operating level with a rapid transition. The transition must be rapid so as to prevent a photon, which is arriving while the voltage has not yet reached the normal operating level but is in any case already higher than the breakdown voltage, from triggering the avalanche in the photodiode under conditions other than normal, thus determining a degradation of the performance obtained.

There are several problems which arise in obtaining the correct operation of the photodiode and of the corresponding quenching circuit. In particular it is necessary to avoid the production of more than one output pulse in response to an avalanche front, or even a persistent oscillation of the quenching circuit, which arises spontaneously or due to the arrival of an avalanche front.

Such operating irregularities are to be feared since:

(a) on the one hand, the quenching circuit must be sensitive to avalanche current pulses of 1 mA or less, that is, typically to signals of 50 mV or less across an input having a resistance of 50 Ohms;

(b) on the other hand, the quenching pulses applied across the photodiode must have a considerable amplitude, from a few volts to several tens of volts according to the photodiode used. These pulses cannot have a perfectly ideal rectangular shape, with no oscillations or overshoots on the rapid leading and trailing edges. Even if they are well shaped, they have irregularities which, although they appear very small in percentage proportion to the amplitude of the pulse, (typically from 1 to 3%), when compared to the sensitivity of the quenching circuit they are really quite large, from tens to hundreds of mV. It is therefore necessary to prevent such inevitable irregularities in the quenching pulse from retriggering the circuit, particularly in correspondence to the trailing edge of the quenching pulse.

A particular problem arises in relation to the requirement of operating the quenching circuit correctly, avoiding the above operating irregularities and corresponding drawbacks, even with the photodiode located in a remote position with respect to the quenching circuit and connected to it electrically by means of a transmission line, such as a coaxial cable.

This requirement arises in many situations, either to assemble within an apparatus (say, a microscope) the small photodiode detector, or to assemble the detector in a housing to keep it under controlled temperature conditions (say, a cryostat for operation under cryogenic conditions).

Mounting of a photodiode at the end of a coaxial cable drastically increases the danger of spurious retriggering of the quenching circuit. Indeed, to avoid signal reflections at the end of the cable, the latter should be terminated on a load having an impedance equal to the characteristic one of the transmission line, that is, with the cables normally in use, about 50 Ohms. But the photodiode presents a mainly capacitive impedance at the end of the cable, so that at the leading and trailing edges of the quenching pulse reflections are inevitably generated, which, when received by the quenching circuit, can cause spurious triggering.

The active quenching circuits developed so far do not permit to operate the photodiode remote from the circuit and connected to it by a coaxial cable. Furthermore, they accept quenching pulses of just a few volts, and thus permit to bias the photodiode above the breakdown voltage by only these few volts. Lastly, the adjustement of these circuits turns out to be quite critical, as concerns the operating difficulties mentioned above.

The object of the present invention is to accomplish an active quenching circuit for single photon semiconductor avalanche photodiodes, which can avoid the drawbacks mentioned above.

In particular, the object of the present invention is to accomplish an active quenching circuit which can operate without problems even if the photodiode is in a remote position.

The object of the present invention is also to accomplish a quenching circuit capable of applying quenching impulses as high as required in order to bias the photodiode well above the breakdown voltage.

Lastly, the object of the present invention is to accomplish a fast quenching circuit, well synchronized with the leading edge of the avalanche current, and being easy to adjust.

SUMMARIES

An active quenching circuit according to the present invention comprises a signal comparator having a first input connected to the photodiode under control and a second input connected to a balancing impedance equal to that of the photodiode. A generator of the quenching signal is connected to the output of said comparator so as to generate a quenching signal of the photodiode having a predetermined duration each time there is an imbalance between two inputs of the comparator and circuit switching means included in a connecting circuit to said photodiode and to said balancing impedance at the inputs of said comparator and at the outputs of said generator and driven by said quenching signal so as to hold normally high the bias voltage of the photodiode and to lower it below the breakdown level for a predetermined time after the generation of said quenching signal.

In this way, whatever the position of the photodiode with respect to the quenching circuit, the symmetry accomplished at the two comparator inputs achieves the condition that the irregularities of the quenching signals and the reflections generated by the photodiode and by the balancing impedance are equal at the two comparator inputs, so as to cancel one another out and avoid the generation of a false quenching signal. The avalanche current pulse caused by a photon absorbed by the photodiode is instead applied only at the input connected to the photodiode itself and therefore represents a differential signal, which triggers the quenching circuit.

On the other hand, the presence of the circuital switches at the inputs of the quenching circuit permits the application to the photodiode of voltage pulses as large as possible, even up to some tens of volts, without being limited by the peak voltage admissible at the quenching circuit inputs. In addition, such switches contribute to the reduction of the possibility that the quenching circuit may oscillate, since they interrupt a positive feedback loop within the circuit. Lastly they also make possible to have at all times a correct termination of the transmission line (coaxial cable) connected to the quenching circuit, that is a termination having the characteristic impedance of the line, and at the same time to apply the entire avalanche signal to the input of the quenching circuit, avoiding the possibility of diverting part of it to the output of the circuit itself.

BRIEF DESCRIPTION OF THE DRAWINGS

The characteristics of the present invention will be made more evident by the following detailed description of some embodiments illustrated as a non-limiting example in the enclosed drawings, wherein.

DESCRIPTION OF THE PREFERRED EMBODIMENTS

Figure 1:
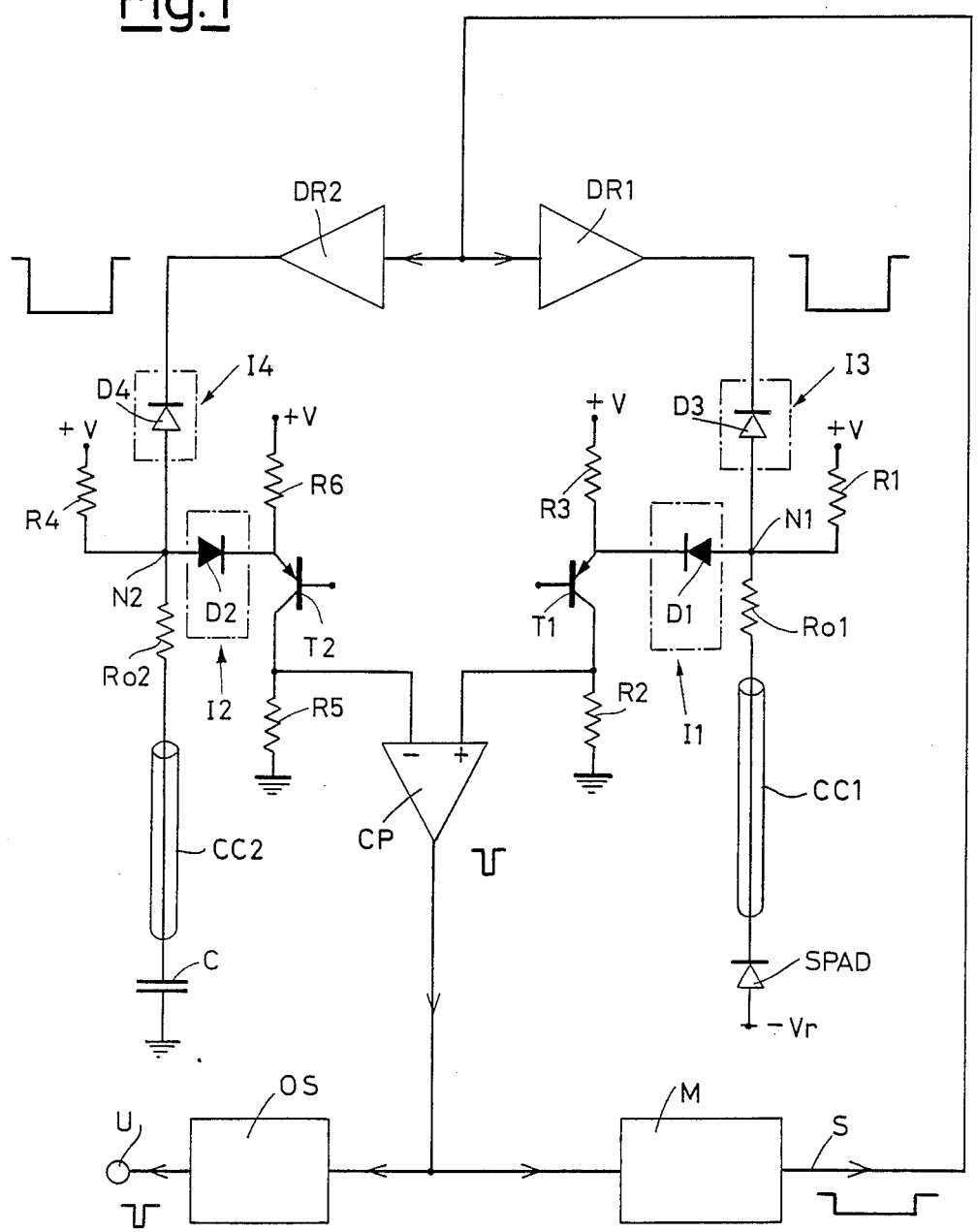
FIG. 1 shows a circuit diagram of quenching circuit having a low impedance input and a series termination for a photodiode in a remote position.

In FIG. 1 it is indicated with SPAD a single photon semiconductor avalanche photodiode, which is arranged in a remote position with respect to the quenching circuit and is connected to it by means of a coaxial cable CC1, in series to which there is a termination resistance Ro1. As is shown, the series of the photodiode SPAD, of the coaxial cable CC1 and of the termination resistance Ro1 is connected between one terminal having, negative voltage $-Vr$ and a circuital branch point N1. The paint N1 is in turn connected to a power supply terminal having positive voltage $+V$ through a resistance R1.

The quenching circuit for the photodiode SPAD comprises a comparator CP, which has a positive input, a negative input and an output which is activated in case of a difference between the two signals applied across the two inputs. A PNP transistor T1, T2 is connected to each of the two inputs, having a common base configuration, that is with the base connected to a low impedance direct power supply and with a signal received by the emitter and delivered by the collector. The function of the transistors T1 and T2 is to present a low impedance to the current signals and to permit them to develop a voltage at the comparator input across a resistance having a value not restricted to that of the characteristic impedance of the line, and in particular greater than the same.

In greater detail, the positive input of the comparator CP is connected to the circuit branch point N1, and thus to the photodiode SPAD, through a PNP transistor T1 having the collector connected to the above positive input and to ground through a resistance R2. The base of the transistor T1 is connected to a positive power supply voltage the emitter of the transistor T1 is connected to a terminal having positive voltage $+V$ through a resistance R3 and to the circuit branch point N1 by means of a normally closed circuital switch I1. In the example of FIG. 1, the switch I1 is constituted, by a normally conductive diode D1 held in conduction by the resistance R1 connected to a positive power supply voltage $+V$.

The negative input of the comparator CP is in turn connected to a circuital branch point N2 through a PNP transistor T2, identical to T1 and having the same circuital configuration, and a normally closed circuital switch I2, identical to I1. That is, in the example of FIG. 1, the switch I2 is constituted by a diode normally held in conduction by a resistance R4 identical to R2, connected to a terminal having positive voltage $+V$. The branch point N2 is, in addition, connected by a termination resistance Ro2 identical to Ro1, and to a coaxial cable CC2 identical to CC1. The cable CC2 has at the other end a termination capacitor C connected to ground, which emulates the characteristic impedance of the SPAD photodiode. The circuital branch point consisting of Ro2, CC2 and C is thus exactly symmetrical with respect to that consisting of Ro1, CC1 and SPAD.

The output of the comparator CP is connected to the input of one output stage OS provided with an output terminal U and also to the input of a monostable multivibrator M. The output of the multibrator M is connected to the input of two identical driver circuits DR1 and DR2, whose outputs are connected to the circuital branch points N1 and N2 by respective normally non-conductive diodes D3 and D4, constituting normally open circuital switches I3 and I4.

Under normal quiescent conditions the photodiode SPAD is biased at a voltage higher than that of breakdown and the two diodes D1 and D2 are both in conduction, that is the switches I1 and I2 are closed, while neither of the two diodes D3 and D4 conduct, that is the switches I3 and I4 are open.

A single photon absorbed by the photodiode SPAD is thus capable of causing an avalanche current through the photodiode itself with a consequent decrease of the current through the transistor T1 and the equally consequent application of a negative voltage front across the positive input of the comparator CP.

The comparator thus detects a differential signal at its inputs and generates at the output a negative front which produces an output at the terminal U and drives the monostable multivibrator M to generate a quenching pulse S having a predetermined duration.

The negative front of the quenching pulse, through the two drives circuits DR1 and DR2, causes the conduction of the diodes D3 and D4 (that is, the closing of the switches I3 and I4) and the cut-off of the diodes D1 and D2 (that is, the opening of the switches I1 and I2) with the consequent application of equal negative voltage fronts across the inputs of the comparator CP, whose output returns with a positive front to the initial level.

At the same time, in correspondence to the negative front the bias voltage of the photodiode SPAD is lowered below the breakdown voltage with consequent quenching of the avalanche.

The quenching signal applied to the photodiode lasts for the time set by the monostable multivibrator M, during which the photodiode SPAD is held in a hold-off condition.

At the end of the above time the positive front of the quenching signal returns the diodes D3 and D4 to a cut-off condition that is, it reopens the switches I3 and I4) and returns the diodes D1 and D2 to conduction (that is, it recloses the switches I2 and I2) and causes the bias voltage of the photodiode SPAD to rise above the breakdown voltage, setting the photodiode itself ready for a new operational cycle. Since the variations detected at the inputs of the comparator CP are identical, the latter's output is unchanged.

It should be noted that driver circuits DR1 and DR2 must be designed as low impedance drivers, so as to be able to drive the considerable voltage excursions required across essentially capacitative loads, such as the photodiode SPAD and the corresponding termination C.

As already said, the generation of the quenching signal causes the application of identical voltage fronts across the two inputs of the comparator CP. This is due to the perfect symmetry of the branch Ro2, CC2 and C with respect to the branch Ro1, CC1 and SPAD which includes the photodiode, and to the symmetry of the two driver circuits DR1 and DR2. Under these conditions, in fact, possible irregularities of the quenching signal and the reflections on the coaxial cables translate into equal effects across the two inputs of the comparator CP, where they cancel each other out, without determining undesirable triggerings of the quenching circuit.

On the other hand, the switches I1, I2, I3 and I4, further reduce the possibility of oscillation of the circuit since they interrupt the feedback loop. Moreover, they cause the entire avalanche current to flow through the circuit input, avoiding that part of it be diverted to the output of the quenching driver.

It should be noted that the switches I1, I2, I3, I4, may be implemented with simple fast-switching diodes, but they may be implemented also with other devices such as field effect transistors with junction structure JFET or with MOS structure MOSFET. Moreover, in those cases where it is sufficient to have a quenching signal with amplitude lower than the breakdown voltage of the emitter-base junction of the PNP transistors N1 and N2, which typically is about 5 volts, the switches I1 and I2 may be constituted by such emitter-base junctions of T1 and T2, avoiding the interposition of the diodes D1 and D2.

Figure 2:
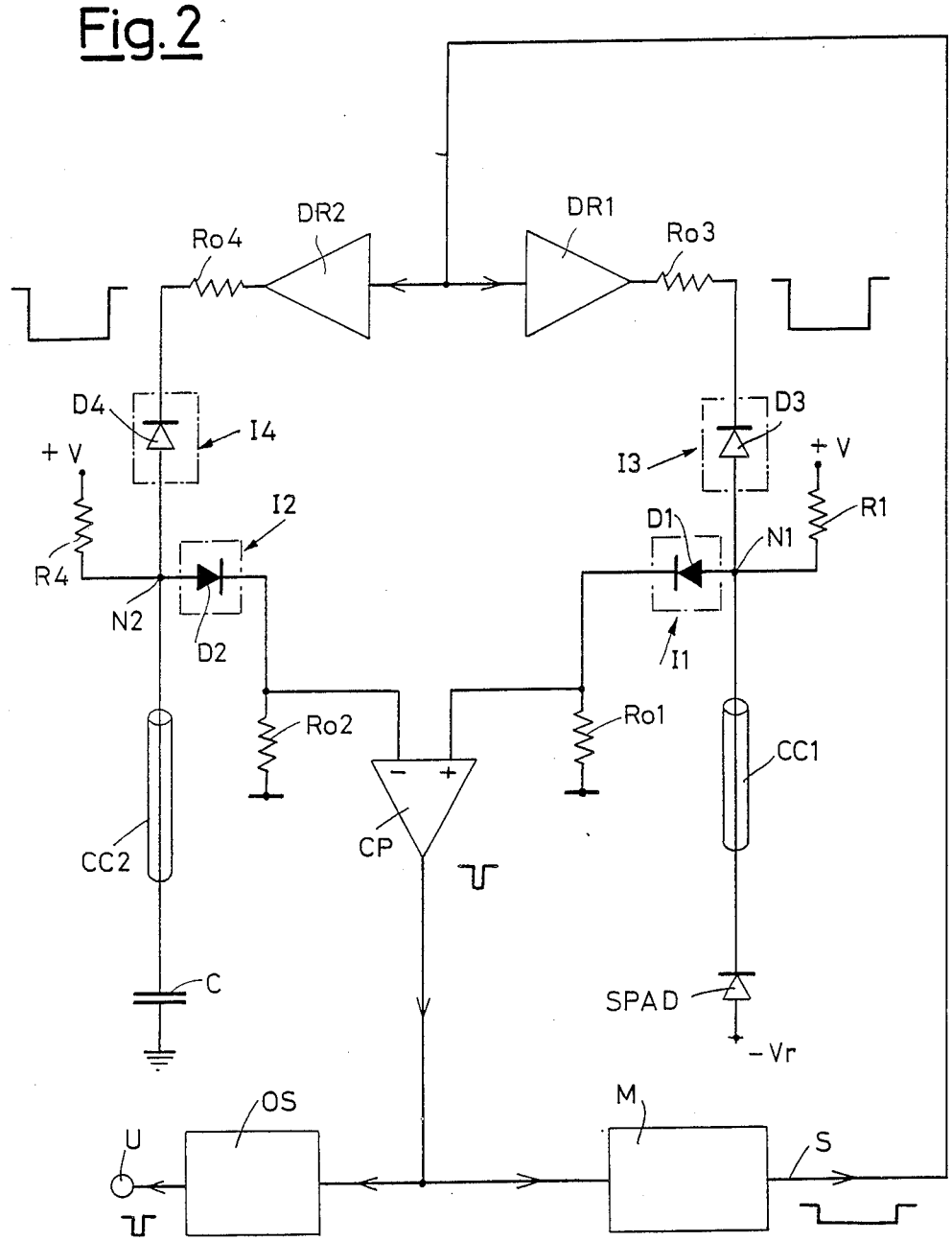
FIG. 2 shows a further circuit diagram having a high impedance input and a parallel termination.

FIG. 2 shows a variant of the quenching circuit according to the invention, which differs from the embodiment exemplified in FIG. 1, in that the circuit inputs have a high impedance and as a consequence the termination resistances Ro1 and Ro2 are connected in parallel to such inputs and placed after the switches I1 and I2 rather than before them.

Further termination resistances Ro3 and Ro4 are placed between the driver circuits DR1 and DR2 and the switches I3 and I4, so that matched line terminations are also provided during the quenching pulse, in the condition wherein the switches I3 and I4 are closed.

In this case the switches I1 and I2 are again illustrated as being constituted by diodes D1 and D2, but they still can be implemented with other electronic components, such as JFET and MOSFET.

Of course, in some cases the photodiode SPAD may be not in a remote position. In such cases the circuits of FIG. 1 and FIG. 2 will evidently not include the coaxial cables CC1 and CC2 and, as a consequence, the resistances Ro1 and Ro2 will no longer be restricted to the value of the cable characteristic impedance.

Figure 3:
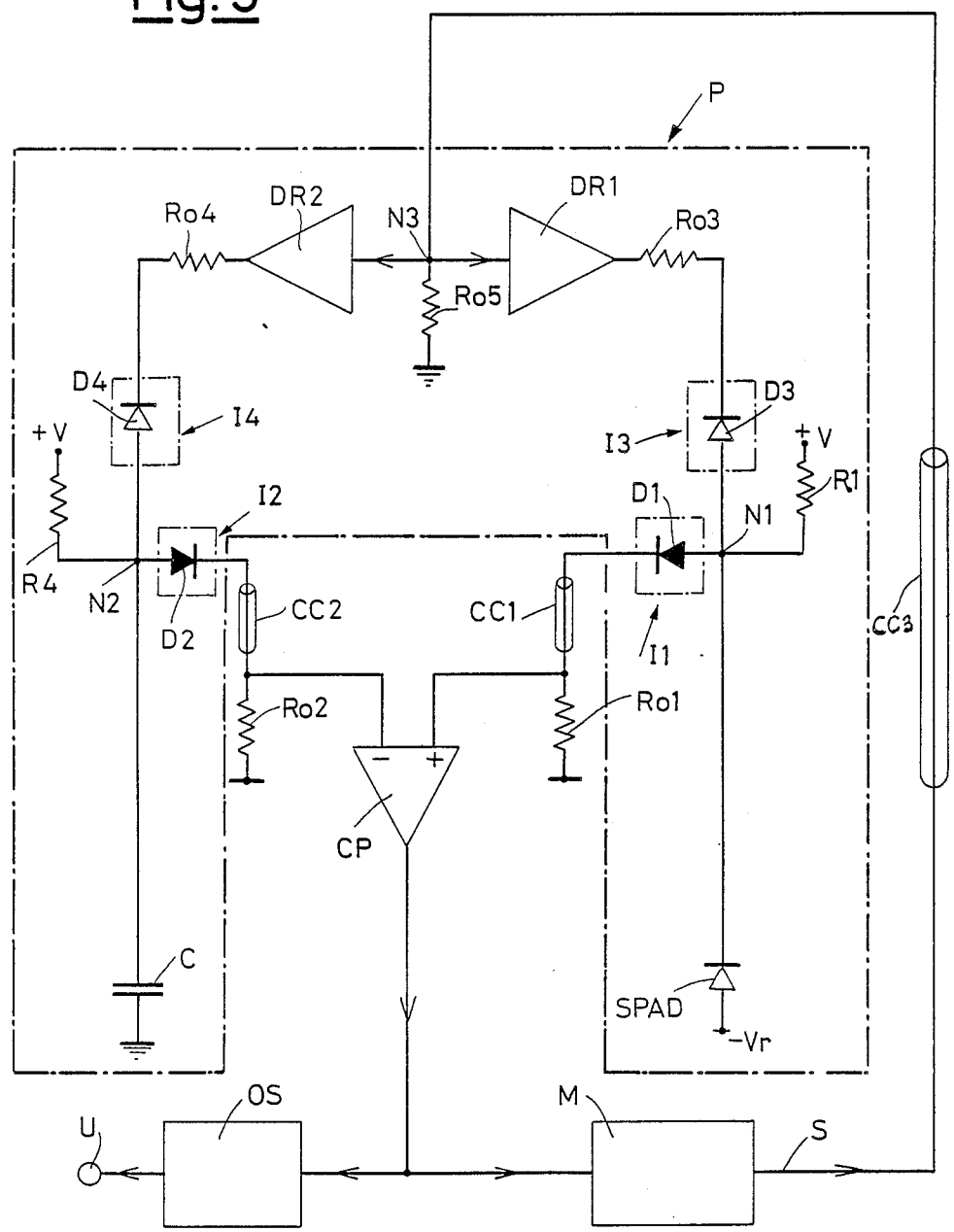
FIG. 3 shows a further embodiment of the quenching circuit according to the invention.

Lastly, FIG. 3 shows a variant of interest in the use of photodiodes requiring very high quenching signals, greater than 10 volts, located far from the quenching circuit.

In such a case, if just the photodiode were located far from the circuit, it would be necessary to charge the entire capacitance of the coaxial cable (of the order of 100 pF per meter of cable) at the quenching signal voltage. This would require the driver circuits DR1 and DR2 to provide very strong currents; it would complicate the implementation of the circuitry and would in practice limit the speed of the obtainable transitions.

It thus appears advantageous to implement a small part of the quenching circuit on a small separate circuit board, on which the photodiode may be mounted. It is sufficient to mount on the small board in question the photodiode SPAD and the symmetrical capacitance C, the two driver circuits DR1 and DR2 and the switches I1, I2, I3 and I4 and to connect the small circuit board to the rest of the circuit by means of coaxial cables CC1, CC2, CC3. In this way the capacitance of the coaxial cable (several hundred pF's) is driven by logic voltage pulses having a small amplitude (typically of the order of half a volt), while the large quenching signal (tens of volts) is applied only to the capacitance associated with the photodiode (of the order of a few pF's).

In FIG. 3 the part of the circuit to be mounted on the small circuit board is, enclosed within a heavy dash-and dot line and indicated with reference letter P. In this case of circuit implementation the two resistances Ro3 and Ro4 must still be symmetrical, of equal value, but they do not have to provide any more a matched termination to the cables CC1 and CC2, from which they are in any case separated by an open switch. Thus the value of Ro3 and Ro4 is not restricted to that of the cable characteristic impedance.

The cable CC3 may be terminated on its characteristic resistance at the output from the monostable multivibrator block M. As an alternative, or in addition, it can be terminated at the other extremity, connected to the branch point N3 of the common input of the two driver circuits DR1 and DR2. A resistance Ro5 is connected between the branch point N3 and ground. The resistance Ro5 has a value equal to that of the characteristic impedance of the cable, that is typically 50 Ohms.

Whichever embodiment is employed (FIG. 1, FIG. 2, FIG. 3 or any other), it should be noted that for SPAD photodiodes operating with the active quenching circuit according to the invention, the recovery of the bias voltage at the end of the hold-off time is fast, but has a finite, non negligible duration. This duration depends on the capacitance to be charged (and therefore on the length of the cables) and on the detailed implementation of the active quenching circuit. It may take from some nanoseconds to some hundred nanoseconds in practical cases.

When the repetition rate of SPAD pulses is high, the probability that a photon will arrive on the photodiode during the recovery from a previous pulse is not negligible.

For photons arriving during a recovery, the electrical output pulse is not correctly related to the true arrival time. Since the SPAD is triggered when the bias voltage is lower than the normal operating level, the rise of the avalanche current is slower and attains a smaller current value. Compared to the operation in normal conditions, the electrical output pulse has therefore a longer delay, referred to the photon arrival time.

Since photons arrive at random times during the voltage rise in the recovery, they trigger the SPAD at random bias voltage levels and generate output pulses with randomly incremented delays.

The resulting problem is that at high repetition rate of the SPAD pulses, a significant percentage of the photons is not correctly timed, that is they generate electrical pulses with randomly incremented delay. This fact causes a degradation of the time resolution obtained in time-correlated single-photon counting.

The above mentioned degradation of the resolution can be avoided by complementing the active-quenching circuit with an auxiliary circuit. The task of this auxiliary circuit is to recognize and reject the pulses corresponding to photons arriving during the recovery of the bias voltage. To this purpose, when the voltage recovery is started, a rectangular pulse is generated, with a duration sufficient to cover the complete voltage recovery, or somewhat longer. This rectangular pulse is used to inhibit output pulses corresponding to SPAD triggering events that occur within the duration of the pulse. This inhibition can be obtained with various types of circuitry. Two possible schemes of the auxiliary circuit are shown in FIGS. 4 and 5.

Figure 4:
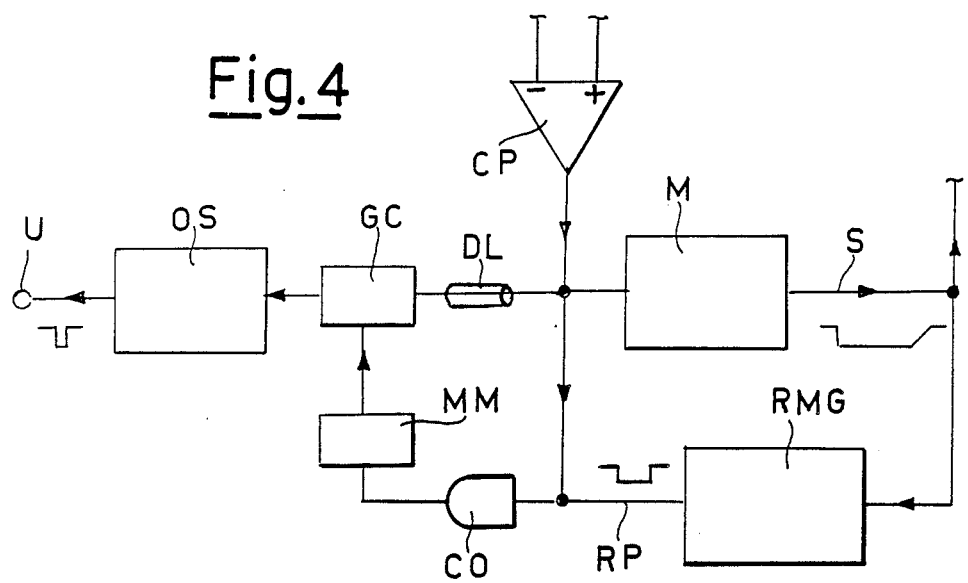
FIGS. 4 and 5 show embodiments of an auxiliary circuit which can be added to the active quenching circuit according to the invention.

According to FIG. 4, the output pulse from the comparator CP is applied to an input of a coincidence (AND) circuit CO and, through an interposed delay line DL, to the input of a gate circuit GC. The other input of the coincidence circuit CO receives a rectangular pulse RP generated by a recovery marker generator RMG. The gate GC is controlled through a monostable multivibrator MM by the coincidence output and is normally open. The output stage OS of the active quenching circuit receives the output pulse of the said gate.

When both pulses are present at the inputs, an AND output pulse is generated which closes the gate circuit GC for a time sufficient to inhibit the CP output pulse from reaching the output stage OS.

Figure 5:
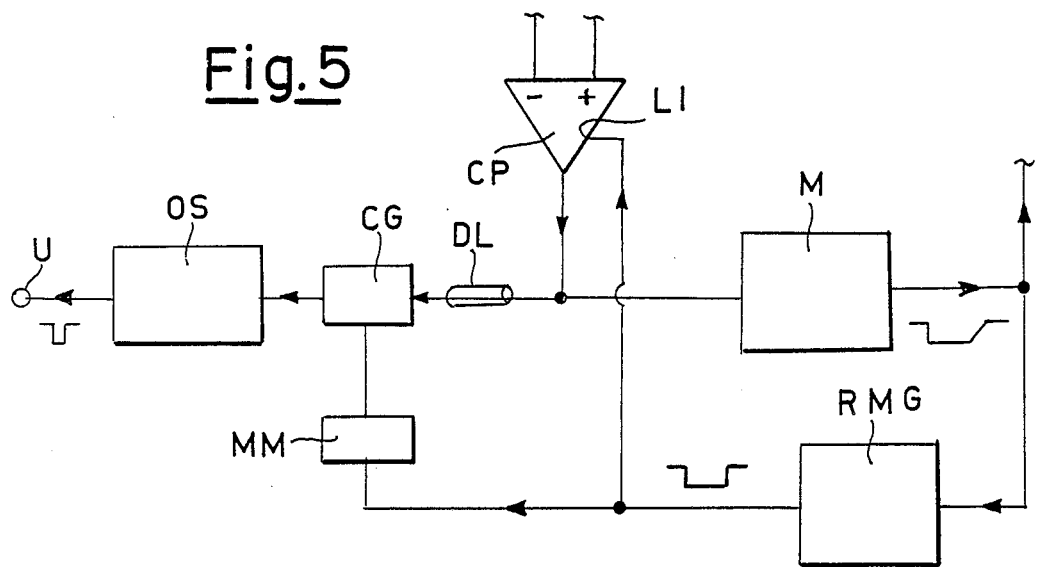

According to FIG. 5, the rectangular pulse RP generated by RMG is applied to a latch input LI of the comparator CP of the active quenching circuit. The comparator CP is therefore latched to its quiescent state; if the SPAD current is triggered within the time interval marked by the the rectangular pulse, the comparator CP will not respond until the the rectangular pulse ends. It may be observed that the SPAD current will not be quenched; it will persist until the said rectangular pulse ends and at this time it will trigger the comparator CP and initiate a quenching cycle. However, it is very easy to inhibit the corresponding pulse to reach the output, since it is synchronized to the trailing edge of the rectangular latching pulse. A normally open gate circuit CG is interposed before the output stage OS. In correspondence to the trailing edge of the latching pulse, a pulse with suitable duration is generated by a monostable multivibrator MM and closes the gate CG.

It is worth noting that there is a further advantage in using the latch as above described, with a duration of the said rectangular pulse somewhat longer than the recovery. In fact, the comparator CP is not retriggered even if the signals at the two inputs of CP are not perfectly matched and therefore do not perfectly cancel each other. The adjustement of the circuit in operating conditions becomes therefore even more easy, since it becomes possible to tolerate some asymmetry in the two input branches of the active quenching circuit, for instance: different cable lengths; imperfect emulation of the SPAD photodiode by the capacitor C at the end of the other cable; etc.

A further note should be added as regards the switches I3 and I4 of FIGS. 1 to 3. The recovery of the bias voltage of the photodiode at the end of the hold-off time has to be as fast as possible. Therefore the recovery has to be driven by a low impedance source, as already stated. To this aim it is advisable that:

(a) the drivers DR1 and DR2 have a low output impedance (as already stated);

(b) the switches I3 and I4 are open only after the completion of the rising edge (positive front) of the quenching pulse (not explicitly stated: it was said that this front reopens the switches, without specifying exactly when during the front);

(c) the switches I3 and I4 are able to conduct a high current in both directions; the implementation of a switch with a simple diode is therefore partially satisfactory. It is better to report to other implementations of the switch, such as field-effect transistors (already mentioned) or more elaborated networks of fast diodes, for instance, two diodes connected in parallel with opposite senses, that is with opposite forward conduction direction.

Finally, an alternative to the use of pulsed drivers DR1 and DR2 is:

(a) to use two separate dc voltage sources corresponding to the quiescent voltage level (HIGH) and to the quenching voltage level (LOW), and (b) to split each the switches I3 and I4 in two switches, one connected to the high voltage source, the other to the low voltage source. The switches are quiescently open as it was for I3 and I4. In correspondence to the negative front of the quenching pulse the switches I1 and I2 are open, the low voltage switches are closed, while the high voltage switches stay open. In correspondence to the positive front of the quenching pulse, at the end of the hold-off time, the low voltage switches are open and the high voltage switches are closed and maintained closed for the recovery of the bias voltage; when the voltage has recovered the high voltage switches are open and the switches I1 and I2 are closed so that the circuit attains its quiescent condition.

I claim:

1. An active quenching circuit for single photon semiconductor avalanche photodiodes, comprising:
    a signal comparator (CP) having a first input connected to the photodiode (SPAD) under control and a second input connected to a balancing impedance (C) equal to that of the photodiode (SPAD);
    a quenching signal generator (M) connected to the output of said comparator (CP) so as to generate a quenching signal (S) of the photodiode (SPAD), said quenching signal having a predetermined duration each time there is an imbalance between two inputs of the comparator; and,
    circuit switching means (I1-I4) included in a connecting circuit to said photodiode (SPAD) and to said balancing impedance (C) at the inputs of said comparator (CP) and to the output of said generator (M), said circuit switching means (I1-I4) being driven by said quenching signal (S) so as to hold normally high the bias voltage of the photodiode (SPAD) and to lower it below the breakdown level for a predetermined time after the generation of said quenching signal (S).

2. A quenching circuit according to claim 1, wherein said photodiode (SPAD) is located in a remote position and connected to the circuit by means of coaxial cable (CC1); and,
    said balancing impedance (C) constitute the termination of an identical coaxial cable (CC2) arranged symmetrically with respect to the first coaxial cable (CC1).

3. A quenching circuit according to claim 1, wherein said circuit switching means (I1-I4) includes:
    two normally closed switches (I1, I2), a first of said normally closed switches (I1) being connected between the photodiode (SPAD) and the first input of said comparator (CP) and a second of said normally closed switches (I2) being connected between the balancing impedance (C) and the second input of said comparator (CP); and,
    two normally open swtiches (I3, I4), a first of said normally open switches (I3) being connected between said photodiode (SAPAD) and a first driver circuit (DR1) and a second of said normally open switches (I4) being connected between said blanacing impedance (C) and a second driver circuit (DR2), said driver circuits (DR1, DR2) being located at the output of said generator (M).

4. A Quenching circuit according to claim 3, characterized in that it includes matched termination resistances (Ro1, Ro2) connected upstream from said normally closed switches (I1, I2) with respect to said inputs of the comparator (CP).

5. A Quenching circuit according to claim 3, characterized in that it includes matched termination resistances (Ro1, Ro2) connected downstream from said normally closed switches (I1, I2) with respect to said inputs of the comparator (CP).

6. A Quenching circuit according to claim 5, characterized in that it includes further matched termination resistances (Ro3, Ro4) associated to the output of said driver circuits (DR1, DR2).

7. A Quenching circuit according to claim 3, characterized in that said photodiode (SPAD), said balancing impedance (C) and said switches (I1-I4) together with the driver circuits (DR1, DR2) are fitted on a small circuit board (P) separated from the rest of the quenching circuit and connected to it by means of coaxial cables (CC1, CC2, CC3) terminated on their characteristic impedance at at least one end.

8. A Quenching circuit according to claim 1, characterized in that an auxiliary circuit (RMG, CO, MM, DL, CG; RMG, MM, DL, CG) is provided which includes a recovery marker generator (RMG) responsive to each start of a voltage recovery to generate a rectangular pulse (RP) with a duration sufficient to cover the complete voltage recovery time and circuit means (CO, MM, DL, CG; MM, DL, CG) responsive to said rectangular pulse to inhibit output pulses of the quenching circuit 9. A quenching circuit according to claim 8, wherein said circuit means of the auxiliary circuit comprises:
    a coincidence circuit (CO) for serving the coincidence of said rectangular pulse (RP) and the comparator (CP) output signal; and,
    a gate circuit interposed between the comparator output and a quenching circuit output stage (OS), said gate circuit being controlled by said coincidence circuit (CO).

10. A quenching circuit according to claim 8, characterized in that said circuit means of the auxiliary circuit include a connection for applying the rectangular pulse (RP) to a latch input (LI) of the comparator (CP) and a control gate (CG) interposed between the comparator output and a quenching circuit output stage (OS) and controlled by said rectangular pulse (RP).

11. A Quenching circuit according to claim 3, characterized in that said driver circuits (DR1, DR2) have a low output impedance and said normally open switches (I3, I4) are open only after the completion of a rising edge of the quenching signal (S) and are able to conduct a high current in opposite directions.

12. A quenching circuit according to claim 1, wherein said circuit switching means (I1-I4) includes
    two normally closed switches (I1, I2) a first of said normally closed switches (I1) being connected between the photodiode (SPAD) and the first input of said comparator (CP) and a second of said normally closed switches (I2) being connected between the balancing impedance (D) and the second input of said comparator (CP); and,
    two normally closed switches (I3, I4), a first of said normally closed switches (I3) being connected between said photodiode (SPAD) and a d.c. voltage source and a second of said normally closed switches being connected between said balancing impedance (C) and said d.c. voltage course, each of said normally closed switchers (I3, I4) comprising one switch connected to a high voltage source and of another switch connected to a low voltage source.

* * * * *